US008354665B2

(12) United States Patent
Jiang et al.

(10) Patent No.: US 8,354,665 B2
(45) Date of Patent: Jan. 15, 2013

(54) SEMICONDUCTOR LIGHT-EMITTING DEVICES FOR GENERATING ARBITRARY COLOR

(75) Inventors: Fengyi Jiang, Jiangxi (CN); Li Wang, Jiangxi (CN); Junlin Liu, Jiangxi (CN); Yingwen Tang, Jiangxi (CN)

(73) Assignee: Lattice Power (JIANGXI) Corporation, Nanchang (CN)

( * ) Notice: Subject to any disclaimer, the term of this patent is extended or adjusted under 35 U.S.C. 154(b) by 0 days.

(21) Appl. No.: 13/059,388

(22) PCT Filed: Aug. 19, 2008

(86) PCT No.: PCT/CN2008/001492
§ 371 (c)(1),
(2), (4) Date: Feb. 16, 2011

(87) PCT Pub. No.: WO2010/020068
PCT Pub. Date: Feb. 25, 2010

(65) Prior Publication Data
US 2012/0037883 A1 Feb. 16, 2012

(51) Int. Cl.
*H01L 33/04* (2010.01)
(52) U.S. Cl. ........................................................ 257/13
(58) Field of Classification Search .................... 257/81, 257/82, 91, 98–100, 116, 117, 432–437, 257/749, E25.032
See application file for complete search history.

(56) References Cited

U.S. PATENT DOCUMENTS

| | | | |
|---|---|---|---|
| 6,271,537 B1 * | 8/2001 | Gunapala et al. | 257/21 |
| 6,924,514 B2 * | 8/2005 | Suenaga | 257/98 |
| 2004/0041220 A1 * | 3/2004 | Kwak et al. | 257/432 |
| 2004/0072383 A1 | 4/2004 | Nagahama | |
| 2007/0252512 A1 | 11/2007 | Bertram | |
| 2008/0087902 A1 * | 4/2008 | Lee et al. | 257/88 |
| 2008/0246054 A1 * | 10/2008 | Suzuki | 257/103 |
| 2011/0180781 A1 * | 7/2011 | Raring et al. | 257/13 |

* cited by examiner

*Primary Examiner* — Dao H Nguyen
*Assistant Examiner* — Tram H Nguyen
(74) *Attorney, Agent, or Firm* — Shun Yao; Park, Vaughan, Fleming & Dowler LLP

(57) ABSTRACT

A light-emitting device includes a conductive substrate (320), a multilayer semiconductor structure situated above the conductive substrate including a n-type doped semiconductor layer (308), a p-type doped semiconductor layer (312) situated above the n-type doped semiconductor layer (308), and a MQW active layer (310) situated between the p-type and n-type doped semiconductor layer (308,312). The multilayer semiconductor structure is divided by grooves (300) to form a plurality of independent light-emitting mesas (304,306). At least one light-emitting mesa (304,306) comprises a color conversion layer (324,326).

14 Claims, 4 Drawing Sheets

SEMICONDUCTOR LIGHT-EMITTING DEVICES FOR GENERATING ARBITRARY COLOR

BACKGROUND

1. Field of the Invention

The present invention relates to the design of semiconductor light-emitting devices. More specifically, the present invention relates to novel semiconductor light-emitting devices which can generate light with arbitrary color.

2. Related Art

Solid-state lighting is expected to be the next wave of illumination and display technologies. In addition to emerging novel applications, such as serving as the light source for display devices and replacing light bulbs for conventional lighting, light-emitting-diodes (LEDs) can be used directly for panel display. LED active display has the advantage of shorter refreshing time, larger viewing angle, and lower power consumption.

An LED produces light from an active region, which is "sandwiched" between a positively doped layer (p-type doped layer) and a negatively doped layer (n-type doped layer). When the LED is forward-biased, the carriers, which include holes from the p-type doped layer and electrons from the n-type doped layer, recombine in the active region. In direct band-gap materials, this recombination process releases energy in the form of photons, or light, whose wavelength corresponds to the energy band-gap of the material in the active region.

Depending on substrate material and the design of the semiconductor layer stack, an LED can be formed using two configurations, namely the lateral-electrode (electrodes are positioned on the same side of the substrate) configuration and the vertical-electrode (electrodes are positioned on opposite sides of the substrate) configuration. FIG. 1A illustrates the cross section of a typical vertical-electrode LED which includes a conductive substrate layer 102, an n-type doped layer 104, a multiple-quantum-well (MQW) active layer 106, a p-type doped layer 108, a p-side electrode 110 coupled to conductive substrate layer 102, and an n-side electrode 112 coupled to n-type doped layer 104.

The vertical-electrode configuration makes packaging of the device easier. In addition, because the electrodes are located on opposite sides of the device, a vertical-electrode LED is more resistant to electrostatic discharge. Therefore, vertical-electrode LEDs have a higher stability compared with lateral-electrode LEDs. This is especially true for high-power, short-wavelength LEDs.

The recent developments in LED fabrication technology enable the use of GaN-based III-V compound semiconductors, which include AlGaN, InGaN, InGaAlN, and GaN, as materials for short-wavelength LED. These GaN-based LEDs have extended the LED emission spectrum to the green, blue, and ultraviolet region.

In order to expand the light-emitting spectrum of an LED, novel methods have been proposed to include a color (wavelength) conversion layer on top of a short wavelength LED, such as a blue light LED. FIG. 1B illustrates the cross section of such a device. A color conversion layer 114 is deposited on top of an n-type layer 104 and an n-side electrode 112. Note that sometimes the color conversion layer can be part of the LED package. The inclusion of a color conversion layer with the LED can modify the LED emission spectrum. For example, an LED whose emission spectrum is originally in the blue range, which is determined by the structure of MQW, may emit red or green light after color conversion.

A color conversion layer can use fluorescent powder. Such a method utilizes the photoluminous property of a fluorescent powder, which when excited by a light emits a light of different wavelength (color) based on its chemical composition. For example, red fluorescent powder can be excited by a shorter-wavelength blue light emitted by an LED and consequently emits a red light. Similarly, when green fluorescent powder is excited by the same blue light, it emits a green light.

Various techniques have been proposed to use florescent powder to change the color of an LED, especially to produce an LED that emits white light. For example, U.S. Patent Application Publication No. 2005/0168127 has proposed disposing fluorescent powder around an exciting light source. By optimizing the composition of the fluorescent powder according to the wavelength of the exciting light source, the LED can be configured to emit white light. In addition, U.S. Patent Application Publication No. 2005/0230693 has proposed to add red florescent powder to the package material of an LED that has both a green light-emitting layer and a blue light-emitting layer to form a single chip LED with three luminescent spectrums of red, blue, and green wavelengths. However, both techniques are not suitable for forming a color panel LED display because the color of each packaged LED is predetermined and cannot be adjusted dynamically. Moreover, using a packaged LED as a single-color pixel often results in a low fill factor which can lead to undesirable "screen-door" effect on the display.

SUMMARY

One embodiment of the present invention provides a semiconductor light-emitting device. The light-emitting device includes a conductive substrate and a multilayer semiconductor structure situated above the conductive substrate. The multilayer semiconductor structure includes a first doped semiconductor layer, a second doped semiconductor layer situated above the first doped semiconductor layer, and a multiple-quantum-well (MQW) active layer situated between the first and the second doped semiconductor layers. The multilayer semiconductor structure is divided by grooves to form a plurality of independent light-emitting mesas. At least one light-emitting mesa comprises a color conversion layer.

In a variation on this embodiment, the conductive substrate includes at least one of the following materials: Si, GaAs, GaP, Cu, and Cr.

In a variation on this embodiment, the first doped semiconductor layer is a p-type doped semiconductor layer which includes GaN doped with Mg.

In a variation on this embodiment, the second doped semiconductor layer is an n-type doped semiconductor layer which includes GaN doped with Si.

In a variation on this embodiment, the MQW active layer includes GaN and InGaN.

In a variation on this embodiment, the color conversion layer includes fluorescent powder.

In a variation on this embodiment, different light-emitting mesas emit light of different colors.

In a further variation on this embodiment, the light-emitting mesas emit red, green, and blue light.

In a variation on this embodiment, the light-emitting device includes a first electrode coupled to the conductive substrate and a plurality of electrodes coupled to the second doped semiconductor layer of the plurality of the light-emitting mesas, wherein the plurality of electrodes can be controlled independently.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

Overview

Embodiments of the present invention provide a light-emitting device which can generate light with arbitrary color. The device includes a conductive substrate, a multilayer semiconductor structure divided by grooves to form a plurality of light-emitting mesas. At least one light emitting-mesa includes a color conversion layer. The light-emitting device may include light-emitting mesas that emit red, green, and blue light. The intensity of each light-emitting mesa can be adjusted independently. Therefore, the mixed light emitted from the light-emitting device can be of arbitrary color.

Substrate Preparation

In order to grow a crack-free GaN-based III-V compound semiconductor multilayer structure on a large-area growth substrate (such as a Si wafer), and to form individually separated light-emitting mesas, a growth method that pre-patterns the substrate with grooves and mesas is introduced. Pre-patterning the substrate with grooves and mesas before the growth of a multilayer semiconductor structure can effectively release the stress built up inside the multilayer structure. Such stress is usually caused by lattice-constant and thermal-expansion-coefficient mismatches between the substrate surface and the multilayer structure and may introduce defects, even cracks.

Figure 1A:
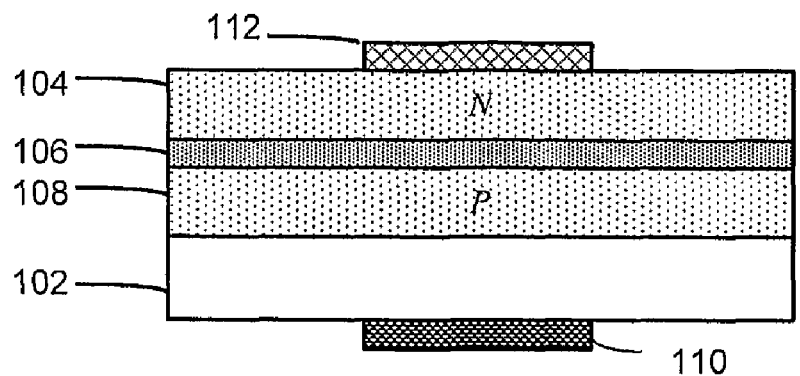
FIG. 1A illustrates the cross section of an exemplary vertical-electrode LED.
Figure 1B:
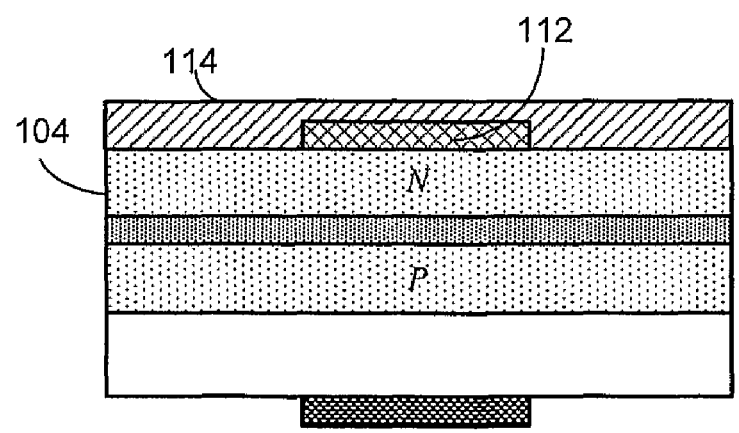
FIG. 1B illustrates the cross section of an exemplary vertical-electrode LED which includes a color conversion layer.
Figure 2A:
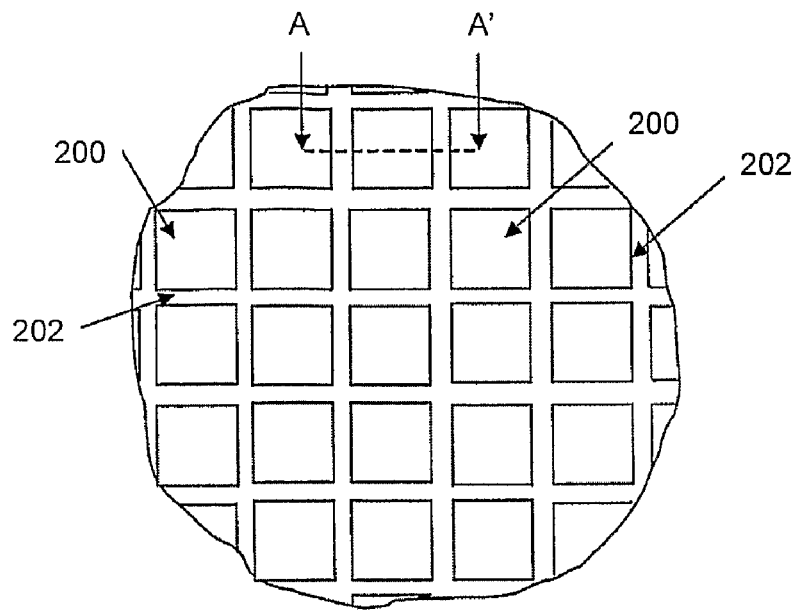
FIG. 2A illustrates part of a substrate with pre-patterned grooves and mesas in accordance with one embodiment of the present invention.
Figure 2B:
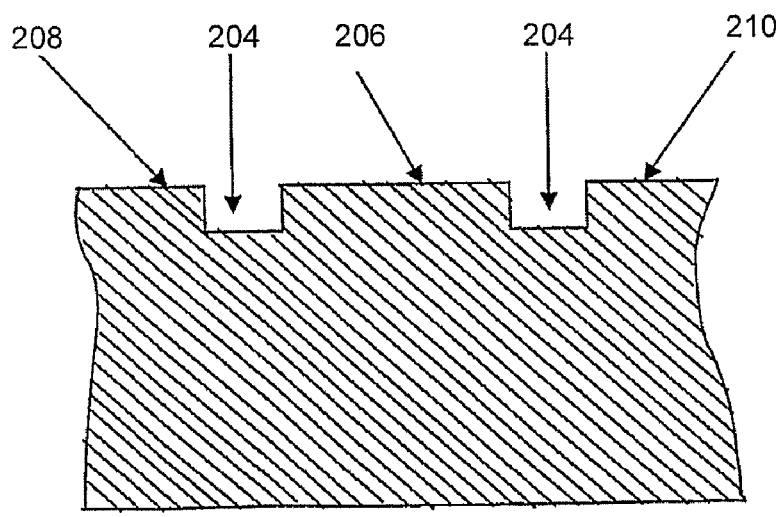
FIG. 2B illustrates the cross section of the pre-patterned substrate in accordance with one embodiment of the present invention.

FIG. 2A illustrates a top view of part of a growth substrate with a pre-etched pattern in accordance with one embodiment of the present invention. Square sections 200 and grooves 202 are the result of etching. FIG. 2B more clearly illustrates the structure of mesas and grooves by showing a cross section of the pre-patterned substrate along a horizontal line A-A' in FIG. 2A in accordance with one embodiment. As seen in FIG. 2B, the sidewalls of intersecting grooves 204 effectively form the sidewalls of the isolated mesa structures, such as mesa 206, and partial mesas 208 and 210. Each mesa defines an independent surface area for growing a respective light-emitting mesa.

Note that it is possible to apply different lithographic and etching techniques to form the grooves and mesas on the semiconductor substrate. Also note that, other than forming square mesas 200 as shown in FIG. 2A, alternative geometries can be formed by changing the patterns of grooves 202. Some of these alternative geometries can include, but are not limited to: triangle, rectangle, parallelogram, hexagon, circle, or other non-regular shapes.

Fabrication

Figure 3:
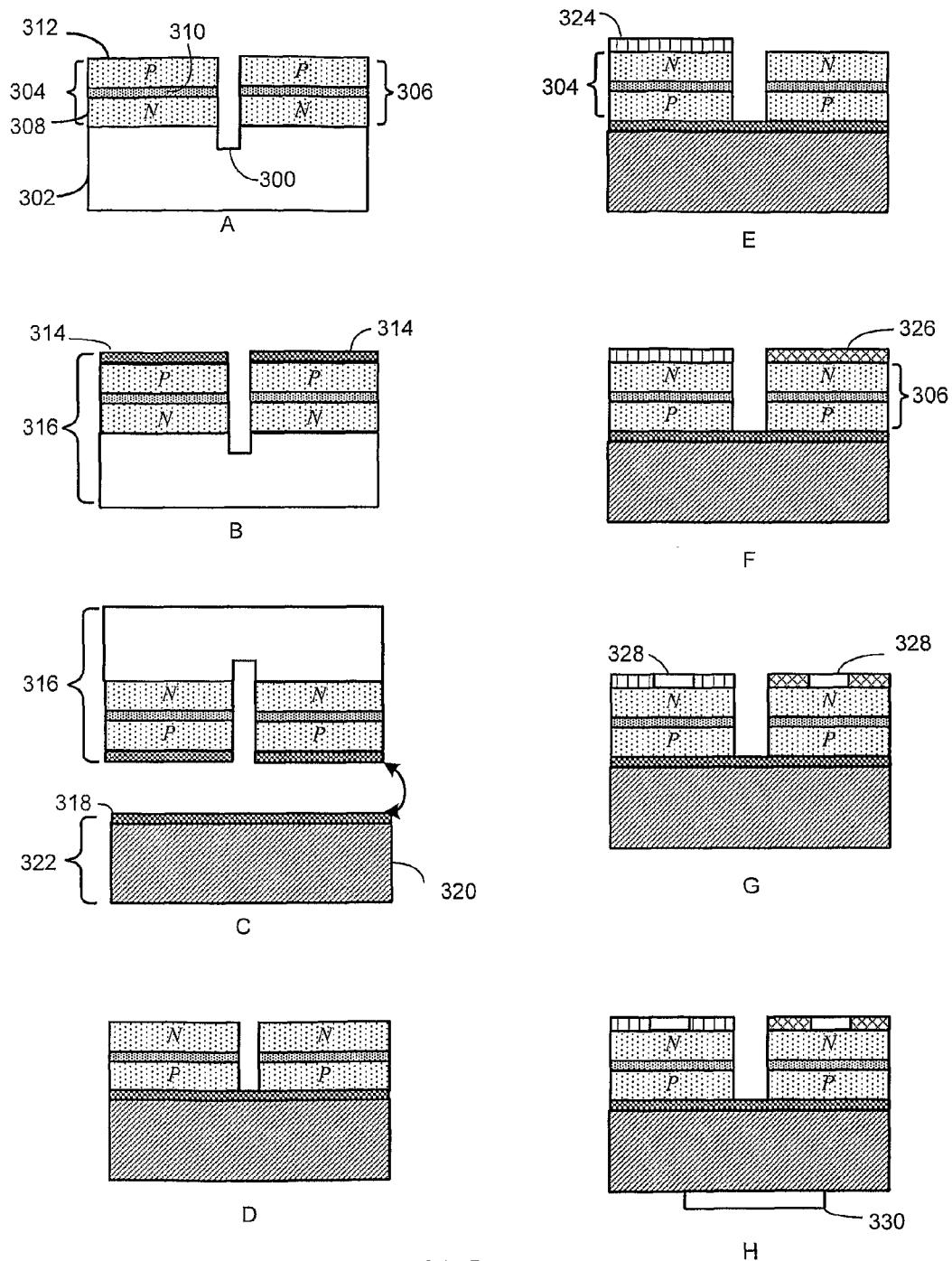
FIG. 3 presents a diagram illustrating the process of fabricating a light-emitting device that can generate light with arbitrary color, in accordance with one embodiment of the present invention.

FIG. 3 presents a diagram illustrating the process of fabricating a light-emitting device that can generate light with arbitrary color in accordance with one embodiment. In operation A, after a pre-patterned growth substrate with grooves and mesas is prepared, an InGaAlN multilayer structure is formed using various growth techniques, which can include, but are not limited to Metalorganic Chemical Vapor Deposition (MOCVD). As an example, in operation A, two light-emitting mesas 304 and 306 are grown on pre-patterned substrate 302, which can be a Si wafer. Due to the pre-existing groove 300 on substrate 302, light-emitting mesas 304 and 306 are spatially separated by groove 300 as well. After growth, both light-emitting mesas 304 and 306 include an n-type doped semiconductor layer 308, which can be a Si-doped GaN layer, an active layer 310, which can include a multi-period GaN/InGaN MQW structure, and a p-type doped semiconductor layer 312, which may be based on Mg-doped GaN. Note that it is possible to reverse the growth sequence between the p-type doped layer and the n-type doped layer.

In operation B, a bonding layer 314 is formed on top of the p-type layer 312. Materials that are used to form bonding layer 314 may include gold (Au).

In operation C, multilayer structure 316 is flipped upside down to bond with a supporting structure 322. In one embodiment, supporting structure 322 includes a bonding layer 318 and a conductive substrate 320. Bonding layer 318 may include Au. Conductive substrate 320 can include at least one of the following materials: Si, GaAs, GaP, Cu, and Cr.

In operation D, growth substrate 302 is removed by, for example, a mechanical grinding technique or a chemical etching technique.

In operation E, a color conversion layer 324 is selectively formed on top of light-emitting mesa 304. The formation of color conversion layer 324 may involve photolithographic and thin film deposition processes. In one embodiment, color conversion layer 324 includes fluorescent powder of a certain color. For GaN based LED emitting blue light, possible choices of fluorescent powders for the color conversion layer include, but are not limited to: red, green, and yellow fluorescent powders. Materials used for red fluorescent powder may include but are not limited to: $Y_2O_3:Eu^{3+}$, $Y_2O_3:Bi^{3+}$, $(Y, Gd)_2O_3:Eu^{3+}$, $(Y, Gd)_2O_3:Bi^{3+}$, $Y_2O_2S:Eu^{3+}$, $Y_2O_2S:Bi^{3+}$, $(Me_{1-x}Eu_x)ReS$, $6MgOAs_2O_5:Mn$, $Mg_3SiO_4:Mn$, $LiEuW_2O_8$, $CaS:Eu^{2+}$, $SrS:Eu^{2+}$, and $Ba_2Si_5N_8$. Materials used for green fluorescent powder may include but are not limited to: $YBO_3:Ce^{3+}$, $YBO_3:TB^{3+}$, $SrGa_2O_4:Eu^{2+}$, $SrAl_2O_4:Eu^{2+}$, and $(Ba, Sr)MgAl_{10}O_{17}:Eu^{2+},Mn^{2}$.

In operation F, another color conversion layer 326 is formed on top of light-emitting mesa 306. The formation of color conversion layer 326 is similar to that of color conversion layer 324. The material used to form color conversion layer 326 can be same as or different than that of color conversion layer 324. In one embodiment, after the formation of color conversion layers 324 and 326, light-emitting mesas 304 and 306 can emit light of different colors.

In Operation G, n-side electrodes 328 are formed on top of the light-emitting mesas and are coupled to n-type doped layer 308. N-side electrodes 328 may include several types of metal such as nickel (Ni), gold (Au), and platinum (Pt). Before forming n-side electrodes 328, photolithographic and etching processes are applied to color conversion layers 324 and 326 to expose part of the n-type doped layer. Then a metal layer is deposited using an evaporation technique such as electro-beam (e-beam) evaporation followed by a lift-off process. In one embodiment of the present invention, the n-side electrode is formed before the formation of the color conversion layers.

In operation H, a p-side electrode 330 is formed on the back of conductive substrate 320, and is coupled to the p-type doped layer. The metal composition and the formation of the p-side electrode can be similar to that of the n-side electrode. Note that the two-mesa device illustrated in FIG. 3 can be used to form a two-color pixel. Each light-emitting mesa's illumination strength can be individually controlled. P-side electrode 330 servers as a common electrode for these mesas. As described in subsequent sections, other numbers of light-emitting mesas, e.g. four, six, or nine, can be used to form a color pixel.

Color Pixels

Figure 4:
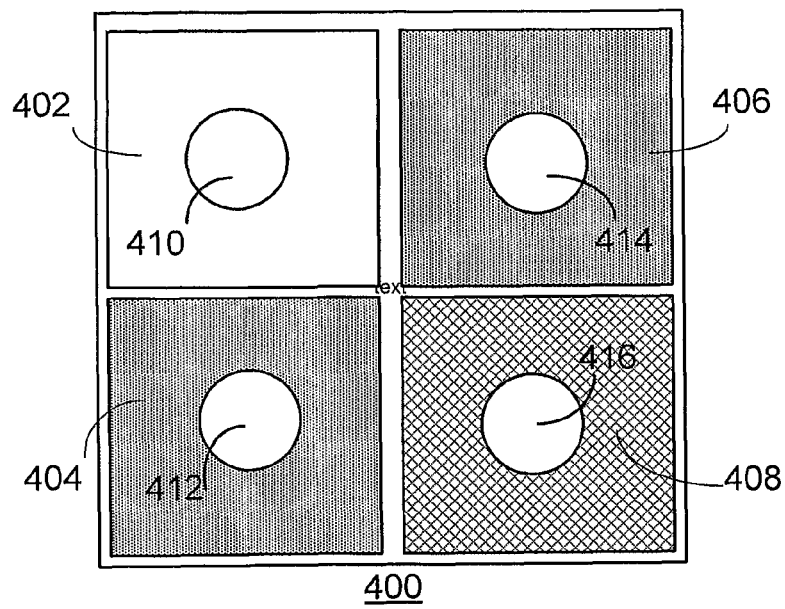
FIG. 4 illustrates the top view of a single pixel which can generate light with arbitrary color, in accordance with one embodiment of the present invention.

FIG. 4 illustrates the top view of a fabricated light-emitting device 400 capable of emitting light of arbitrary color. Light-emitting device 400 includes four light emitting mesas 402, 404, 406, and 408. Light-emitting mesas 404 and 406 include color conversion layers that convert the original blue LED light to green light, and light-emitting mesa 408 includes a color conversion layer that converts the original blue LED light to red light. Light-emitting mesa 402 does not include a color conversion layer and emits the original blue LED light. The current or voltage applied to electrodes 410, 412, 414, and 416 can be adjusted independently. Therefore, the light-emitting intensity of each light-emitting mesa can be adjusted independently. Consequently, one can achieve an arbitrary color mixing result by independently adjusting the intensity of the red, green, and blue colored light. Note that light-emitting device 400 shown in FIG. 4 includes two light-emitting mesas that emit green light. Such an arrangement is to compensate for the relatively low light conversion efficiency of the green fluorescent powder. Other arrangements are also possible to form a light-emitting device that can emit a mixed light of arbitrary color. For example, the shape of each light-emitting mesa is not limited to square, but may also be of other shapes including triangle, rectangle, parallelogram, hexagon, circle, and other non-regular shapes. In addition, the size of each light-emitting mesa may not be the same, and the number of light-emitting mesas in a device can be greater or smaller than four. For example, nine light-emitting mesas can form a color pixel, wherein every three mesas are configured to emit one color (e.g., red, blue, and green). Furthermore, other color configurations using different florescent powders (such as blue, red, and yellow) are also possible.

Being able to emit light with arbitrary color allows light-emitting device 400 to form a pixel in a color panel display. It is possible to fabricate such a pixel in the dimension of less than 1 mm$^2$, which makes the device suitable for high definition display.

Figure 5:
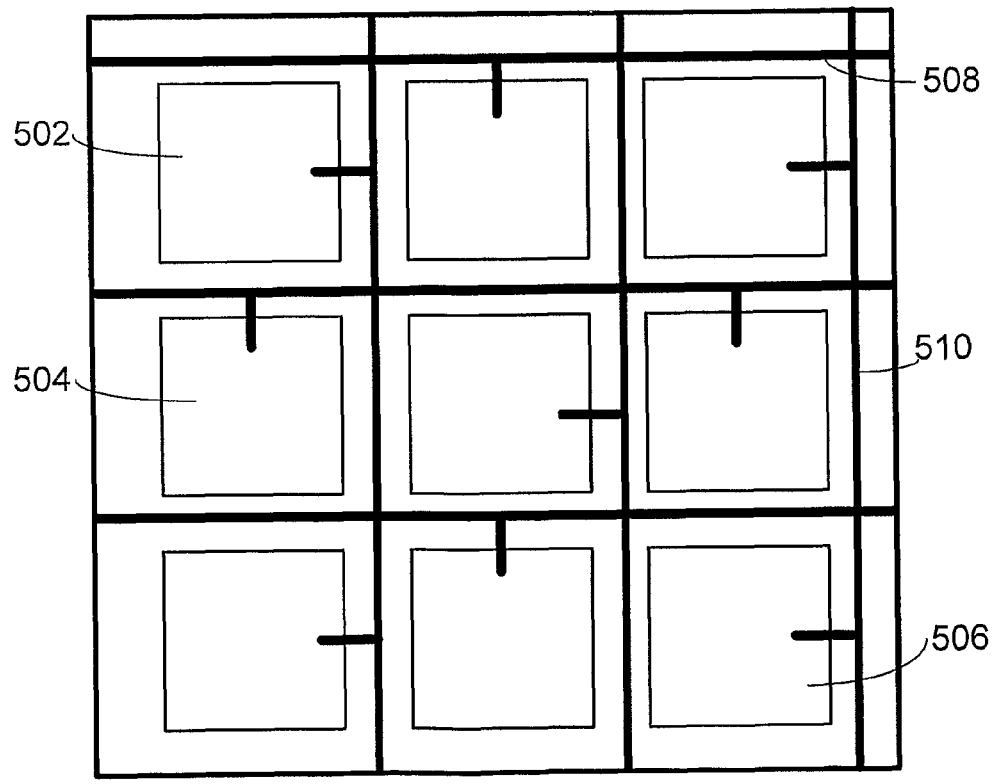
FIG. 5 illustrates a 2-D array of pixels which can generate light with arbitrary color, in accordance with one embodiment of the present invention.

FIG. 5 illustrates a 2-D array that includes a plurality of the aforementioned LED based pixels, for example, pixels 502, 504, and 506, in accordance with one embodiment of the present invention. Note that in order to accommodate a large number of pixels on a single wafer and to achieve independent brightness and color control of each single pixel, the electrodes can be laid out with CMOS technologies using metal strips, for example, metal strips 508 and 510 shown in FIG. 5.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A semiconductor light-emitting device, comprising:
  a conductive substrate;
  a multilayer semiconductor structure situated above the conductive substrate comprising:
    a first doped semiconductor layer;
    a second doped semiconductor layer situated above the first doped semiconductor layer; and
    a multiple-quantum-well (MQW) active layer situated between the first and the second doped semiconductor layers;
  wherein the multilayer semiconductor structure is divided by grooves to form a plurality of independent light-emitting mesas, wherein the light-emitting mesas have a common MQW;
  wherein a first light-emitting mesa comprises a first color conversion layer configured to convert light emitted by the first light-emitting mesa to a first color;
  wherein a second light-emitting mesa comprises a second color conversion layer configured to convert light emitted by the second light-emitting mesa to a second color that is different from the first color; and
  wherein a first light-emission intensity of the first light-emitting mesa and a second light-emission intensity of the second light-emitting mesa are electrically controlled and are independent of each other, thereby allowing light emitted by the semiconductor light-emitting device to have an arbitrary color;
  a first electrode coupled to the conductive substrate;
  a plurality of electrodes coupled to the second doped semiconductor layer of the plurality of the light-emitting mesas, wherein the plurality of electrodes can be controlled independently.

2. The semiconductor light-emitting device of claim 1, wherein the conductive substrate comprises at least one of the following materials:
  Si,
  GaAs,
  GaP,
  Cu, and
  Cr.

3. The semiconductor light-emitting device of claim 1, wherein the first doped semiconductor layer is a p-type doped semiconductor layer comprising GaN doped with Mg.

4. The semiconductor light-emitting device of claim 1, wherein the second doped semiconductor layer is an n-type doped semiconductor layer comprising GaN doped with Si.

5. The semiconductor light-emitting device of claim 1, wherein the MQW active layer comprises GaN and InGaN.

6. The semiconductor light-emitting device of claim 1, wherein the first color conversion layer and/or the second color conversion layer comprise fluorescent powder.

7. The semiconductor light-emitting device of claim 1, wherein the first color and/or the second color include at least one of: red, green, and blue.

8. A method for fabricating a semiconductor light-emitting device, the method comprising:

fabricating a multilayer semiconductor structure on a growth substrate patterned with grooves and mesas, wherein the multilayer semiconductor structure comprises a first doped semiconductor layer, a second doped semiconductor layer, and a multiple- quantum-wells (MQW) active layer;

wherein the multilayer semiconductor structure is divided by grooves to form a plurality of independent light-emitting mesas, wherein the light-emitting mesas have a common MQW;

forming a bonding layer above the multilayer semiconductor structure;

bonding the multilayer semiconductor structure to a conductive substrate;

removing the growth substrate;

forming a first color conversion layer on a first light-emitting mesa, wherein the first color conversion layer is configured to convert light emitted by the first light-emitting mesa to a first color; and forming a second color conversion layer on a second light- emitting mesa, wherein the second color conversion layer is configured to convert light emitted by the second light-emitting mesa to a second color that is different from the first color;

wherein a first light-emission intensity of the first light-emitting mesa and a second light-emission intensity of the second light-emitting mesa are electrically controlled and are independent of each other, thereby allowing light emitted by the semiconductor light-emitting device to have an arbitrary color;

forming a first electrode coupled to the conductive substrate; forming a plurality of electrodes coupled to the second doped semiconductor layer of the plurality of the light-emitting mesas, wherein the plurality of electrodes can be controlled independently.

9. The method of claim 8,
wherein the conductive substrate comprises at least one of the following materials:
Si,
GaAs,
GaP,
Cu, and
Cr.

10. The method of claim 8,
wherein the first doped semiconductor layer is a p-type doped semiconductor layer comprising GaN doped with Mg.

11. The method of claim 8,
wherein the second doped semiconductor layer is an n-type doped semiconductor layer comprising GaN doped with Si.

12. The method of claim 8,
wherein the MQW active layer comprises GaN and InGaN.

13. The method of claim 8,
wherein the first color conversion layer and/or the second color conversion layer comprises fluorescent powder.

14. The method of claim 13,
wherein the first color and/or the second color include at least one of: red, green, and blue.

* * * * *